United States Patent [19]
Girard et al.

[11] Patent Number: 5,870,277
[45] Date of Patent: Feb. 9, 1999

[54] ASSEMBLY OF ELECTRICAL EQUIPMENT, NOTABLY A MOTOR STARTER ASSEMBLY

[75] Inventors: Michel Girard, Corcelles Les Citeaux; Philippe Rix, Dijon, both of France

[73] Assignee: Schneider Electric SA, Boulogne Billancourt, France

[21] Appl. No.: 53,048

[22] Filed: Apr. 1, 1998

[30] Foreign Application Priority Data

Apr. 1, 1997 [FR] France .................................. 97 04042

[51] Int. Cl.⁶ .................................................. H02B 1/26
[52] U.S. Cl. .......................... 361/627; 361/600; 361/601; 361/622; 361/625; 361/631; 361/632; 361/634; 200/307; 307/147
[58] Field of Search .................................. 361/627, 622, 361/626, 632, 634, 643, 102, 600, 601, 605, 610, 614; 200/307, 50.26, 50.27; 307/147

[56] References Cited

U.S. PATENT DOCUMENTS 4,305,114  12/1981  Takagi et al. ............................ 361/614
5,652,420   7/1997  Innes et al. ............................. 200/50.32

*Primary Examiner*—Leo P. Picard
*Assistant Examiner*—Boris L. Cheruinsky
*Attorney, Agent, or Firm*—Oblon, Spivak, McClelland, Maier & Neustadt, P.C.

[57] ABSTRACT

An assembly of electrical equipment having devices, such as circuit breakers and contactors grouped in pairs, included on a supporting baseplate. Each pair of devices includes a circuit breaker 40 and a contactor 60 and a baseplate 20 having power pins and control pins that cooperate with respective power and control terminals of the devices. Auxiliary units 50,70 are fixed to one of the devices 40,60 while being connected to control terminals 45,65,66 of the one device. The units 50,70 are connected to a linkage with a bus or a control and command system by plugging units 50,70 into control pins 81,82 of the baseplate 20.

7 Claims, 5 Drawing Sheets

5,870,277

ASSEMBLY OF ELECTRICAL EQUIPMENT, NOTABLY A MOTOR STARTER ASSEMBLY

BACKGROUND OF THE INVENTION

1. Field of the Invention

This invention relates to an assembly of electrical equipment for the power control of loads, notably a motor starter assembly that includes, for each load, a pair of devices mounted on a baseplate, each pair of devices comprising a circuit breaker and a contactor provided with power terminals and control terminals, and conductors for the control of the equipment assembly from a process controller or from a bus which is linked to the baseplate.

2. Discussion of Background

Equipment assemblies of this type are well known and must be able to be assembled and disassembled easily. In particular, there has been an increasing tendency to connect motor starter equipment to buses carrying control signals; the word "control" is used here in the broad sense and denotes both the command of the devices in the assembly and the condition signalling for this equipment or the command of other pieces of equipment according to their condition.

DE-2 95 07456 describes a motor starter device in which a circuit breaker and contactors are arranged on a support, while a printed circuit is used to connect the command terminals of the contactors to a bus and the circuit breaker terminals have terminal blocks that can be directly plugged into the terminals of the contactors. With this device, it is necessary to wire the printed circuit to the circuit breaker for the control and the circuit breaker to the contactors for the power.

SUMMARY OF THE INVENTION

It is desirable to simplify the power and control wiring of equipment assemblies of the type described.

The aim of the invention is to facilitate the assembly and the disassembly of electrical equipment assemblies for the power control of loads, notably motor starter assemblies by simplifying their control and/or power wiring.

According to the invention, the baseplate has power pins and control pins that co-operate with respective power and control terminals on the devices and to the pair of devices there is associated at least one auxiliary connection unit which is fixed to at least one of the devices in the pair, connected to the control terminals of this device and provided with control conductors connected to the control pins of the baseplate in such a way that the pair of devices are connected to the baseplate by a prewired control linkage. The word "contactor" denotes here a simple contactor or inverter as well as a couple of contactors assembled in an inverter.

The control wiring is simplified thanks to the auxiliary unit.

The auxiliary unit can be a detachable intermediate unit arranged between the circuit breaker and the contactor, this unit providing the power interconnection between the circuit breaker and the contactor as well as the control connection of the contactor with the baseplate.

It may also be an end unit adjoining the contactor and providing the control connection for the contactor. The end unit can comprise a command relay for the coil of the electromagnet of the contactor, a detachable wiring device for the motor into which are fixed the cables connecting the downstream power terminals of the contactor to the load thereby forming a device for memorising the wiring arrangement as well as forming a shunt that provides the possibility of an external command for the contactor.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein:

Referring now to the drawings, wherein like reference numerals designate identical or corresponding parts throughout the several views, and more particularly to FIG. 1 thereof, there is illustrated a motor starter assembly according to the present invention.

In FIG. 1, the device shown is a motor starter assembly with four elements but it is obvious that it can include a different number of starting elements, for example, one, two or eight. Similarly, the device can be assembled and connected by any of the usual means to a neighbouring device.

Figure 1:
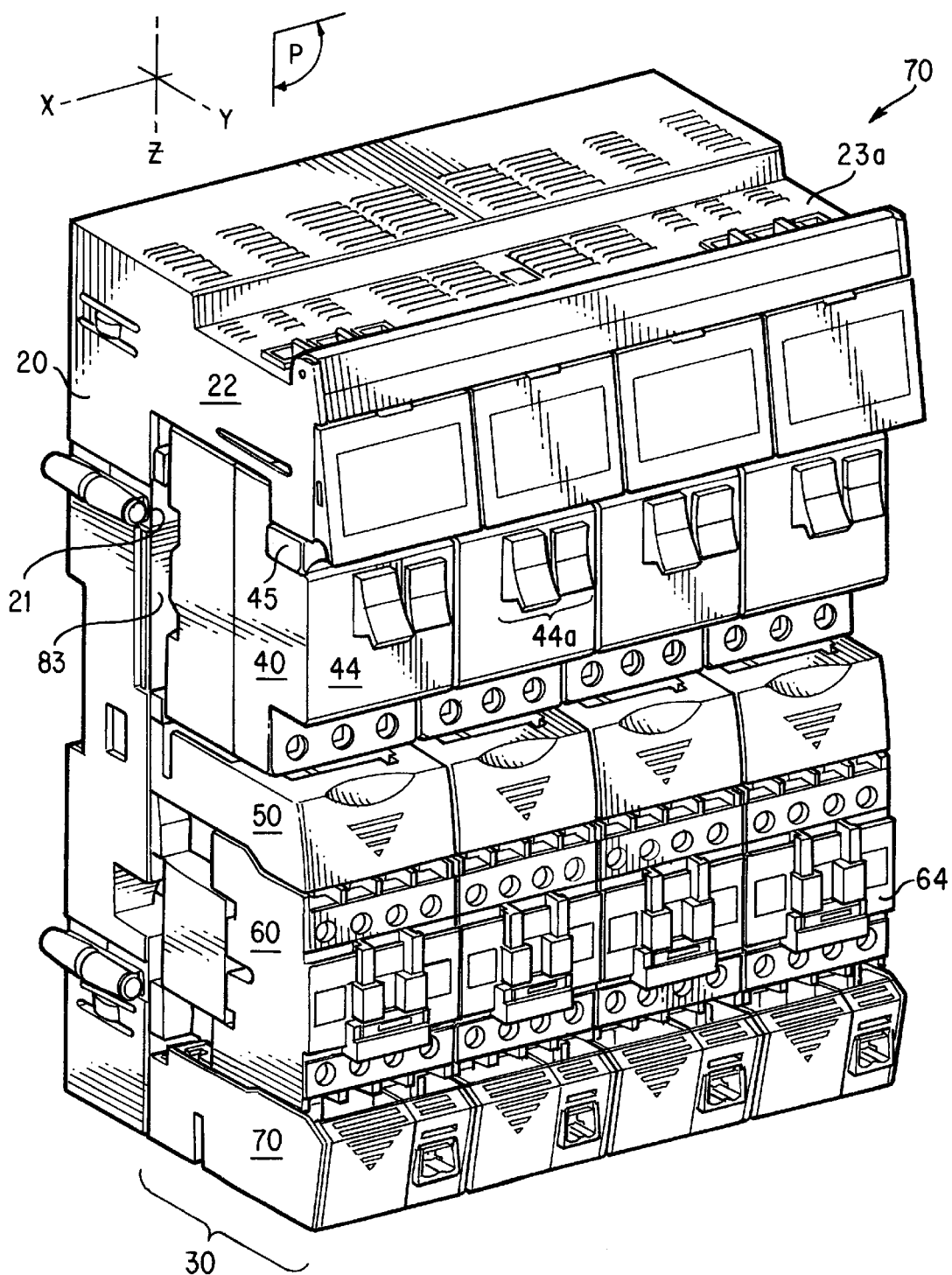
FIG. 1 represents, in perspective, a motor starter equipment assembly conforming to the invention.

The motor starter assembly 10 includes a baseplate 20 on which are housed and connected starter sub-assemblies 30. In order to control a load, each sub-assembly includes a pair of electrical devices and two associated connection units, namely a circuit breaker 40, an intermediate unit 50, a contactor 60 and an end unit 70. The contactor 60 can, in certain applications, be an inverter or two contactors mounted in an inverter. The baseplate 20 can be fixed at the rear to a support by the usual fixing means: clip-on elements, screws, etc.

The baseplate 20 includes a body of small depth fitted with a front support area 21 (see FIG. 2) generally parallel to a plane P to carry the sub-assemblies 30 and to provide the interconnections between their components and, projecting from the body along a direction Y perpendicular to the plane P, an upper overhang 22 in the shape of a bracket; the baseplate houses a set of power supply conductors 23, for example bars (see FIG. 3), which extend along a general direction X parallel to P and are connected on the one hand to a power supply connection at the side or at the front 23a and on the other hand to power connection pins 24 intended for connection to the circuit breaker; the bracket 22 also has control connection pins 25 intended for connection to an auxiliary contact deck itself attached to the circuit breaker; the pins 24 and 25 extend along a direction Z parallel to P and perpendicular to X and Y. The baseplate 20 houses a printed circuit 80 which is parallel to P and provides the control interconnections for the assembly via connectors 81, 82 and the external control connection via the side connectors 83.

The circuit breaker enclosure 40 has upstream 41 and downstream 42 power terminals, accessible for connecting flexible or rigid conductors through the respective orifices 41*a* and 42*a* and with handling tools through the front orifices 41*b*, 42*b*. The circuit breaker 40 has a rear face 43 and jutting out towards the front, a nose 44, fitted with at least one manual opening/closing command button 44*a*. On the nose 44 of the circuit breaker, a signalling auxiliary contact deck 45 is arranged, fitted with terminals 46; the terminals 46 include access at the top 46*a* for the connection of the control pins 25 and front orifices 46*b* for handling these terminals.

The contactor enclosure 60 has upstream 61 and downstream 62 power terminals accessible for the connection of flexible or rigid conductors through upper orifices 61*a* and lower orifices 62*a* and with handling tools, onto a front face 64, through front orifices 61*b*, 62*b*; the contactor enclosure 60 also has a rear face 63 and next to the upstream 61 and downstream 62 power terminals, upstream 65 and downstream 66 control terminals with their respective access orifices 65*a*, 66*a*.

Figure 4:
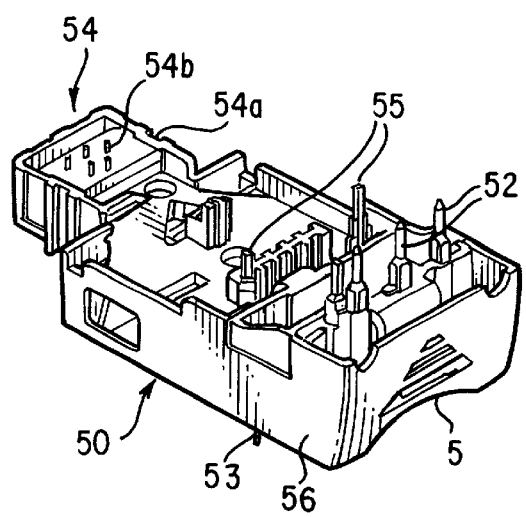
FIG. 4 shows a simple intermediate unit in perspective from below.
Figure 5:
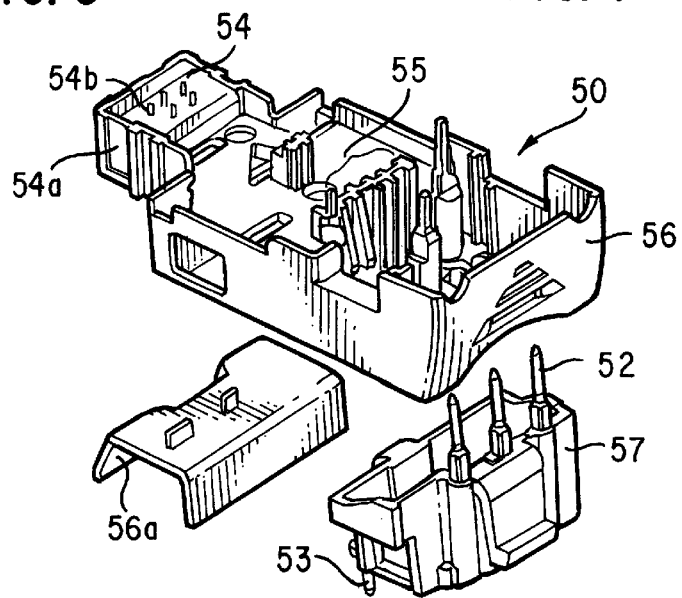
FIG. 5 represents an exploded view of the unit in FIG. 4.

The intermediate unit 50 (see FIGS. 4 and 5) is of small height and mechanically attaches the contactor to the circuit breaker. It includes conductors 51 which provide power interconnection between circuit breaker and contactor, and to this end are terminated on one side by pins 52 in order to co-operate with the downstream power terminals 42 of the circuit breaker 40 and on the other side by pins 53 in order to co-operate with the upstream power terminals 61 of the contactor 60.

The intermediate unit 50 participates in the mechanical assembly of the contactor to the circuit breaker by the clamping of the pins 52, 53 and comprises, at the rear, a fitting and connecting heel 54. This heel is provided with shapes 54*a* that can be fitted into a housing 26 in the baseplate, for example with the help of ribs and grooves. In order to co-operate with the heel 54, the housing 26 has a top abutment face 26*a*, side abutment faces 26*b* and retaining shoulders 26*c* towards the front. The heel 54 is on the other hand fitted with control connection elements 54*b* directed along Z and co-operating with the connector 81 arranged on the printed circuit and accessible at the bottom of the housing 26. The unit 50 has. lower control pins 55 connected to connection elements 54*b*, adjacent the power pins 53 and directed along Z in order to connect to the upstream control terminals 65 of the contactor 60.

The intermediate unit 50 comprises a fitting 56 and a connection die 57 attached and fixed, for example, by clipping or by any other means, into a housing in the fitting 56; the die 57 has conductors 51 moulded into an insulator and offers their end pins 52, 53. Within the fitting 56 a wall 56*a* is located for the diversion of circuit breaker cut-out gases. It should be noted that the intermediate unit 50 has in its upper part, shapes 58 capable of been gripped by one finger of the operator in order to facilitate the displacement of the sub-assembly along Z for its assembly and disassembly.

Figure 6:
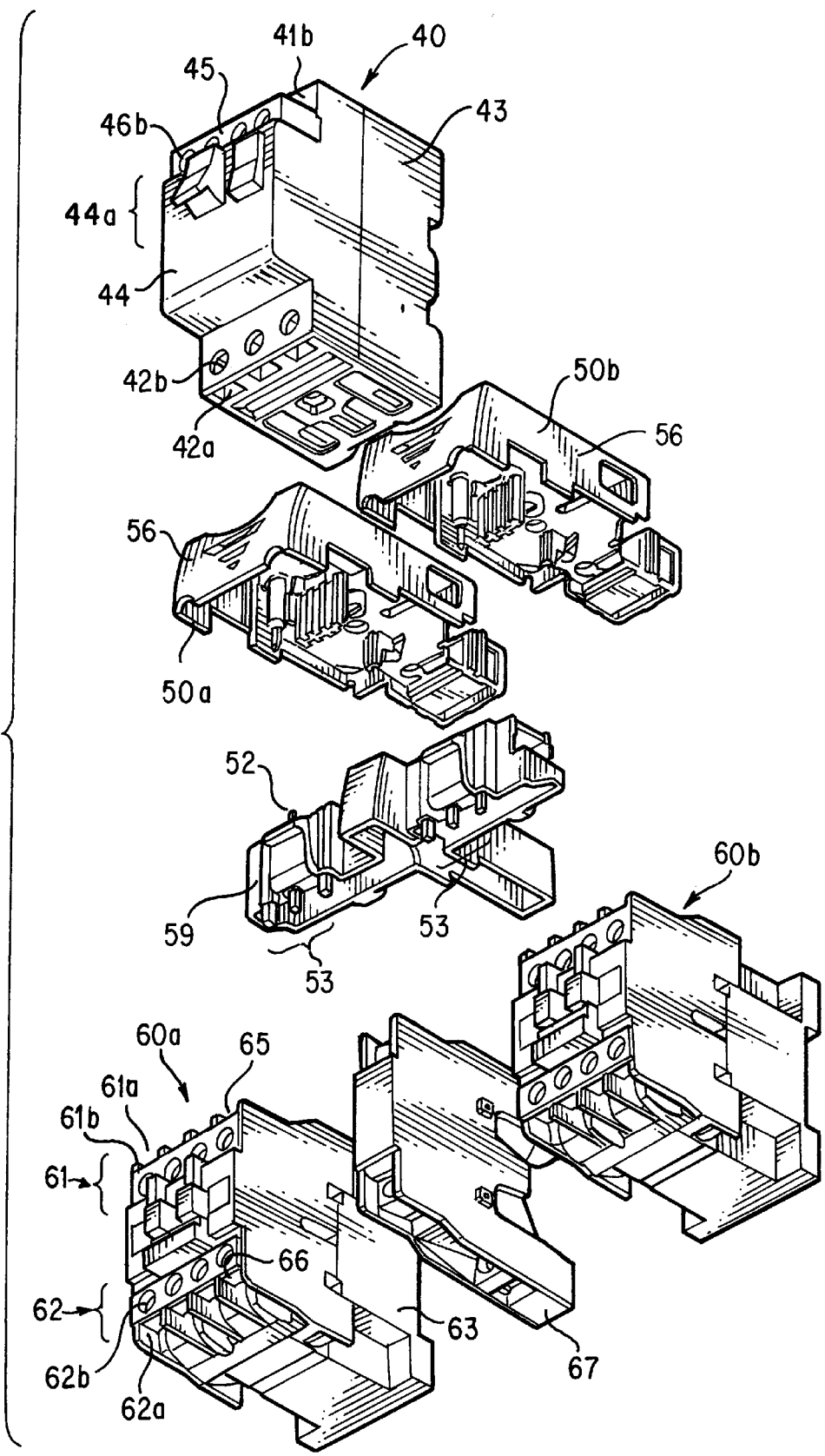
FIG. 6 shows in exploded perspective a circuit breaker linked to a contactor-inverter by means of a double intermediate unit.

In a variant suitable for the application of an inverter starter (FIG. 6), the circuit breaker 40 is linked to a contactor-inverter or to two contactors 60*a*, 60*b* coupled in an inverter by an interlocking intermediate auxiliary contact deck 67. This linkage takes place by means of two intermediate units 50*a*, 50*b* side by side whose fittings 56 are identical to that of the simple unit 50 previously described and which house a double connection die 59; the die 59 has towards the top, a set of power pins 52 that co-operate with the circuit breaker 40 and towards the bottom, two sets of power pins 53 that co-operate with the two contactors 60*a*, 60*b*.

Figure 7:
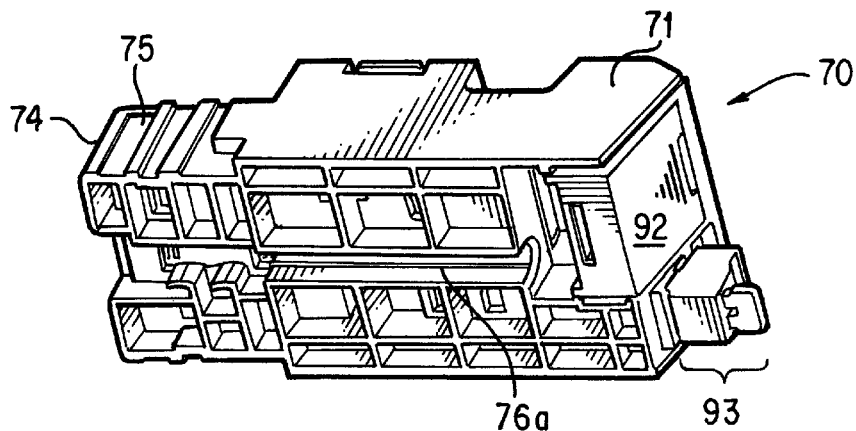
FIG. 7 shows an end unit in perspective from below.
Figure 8:
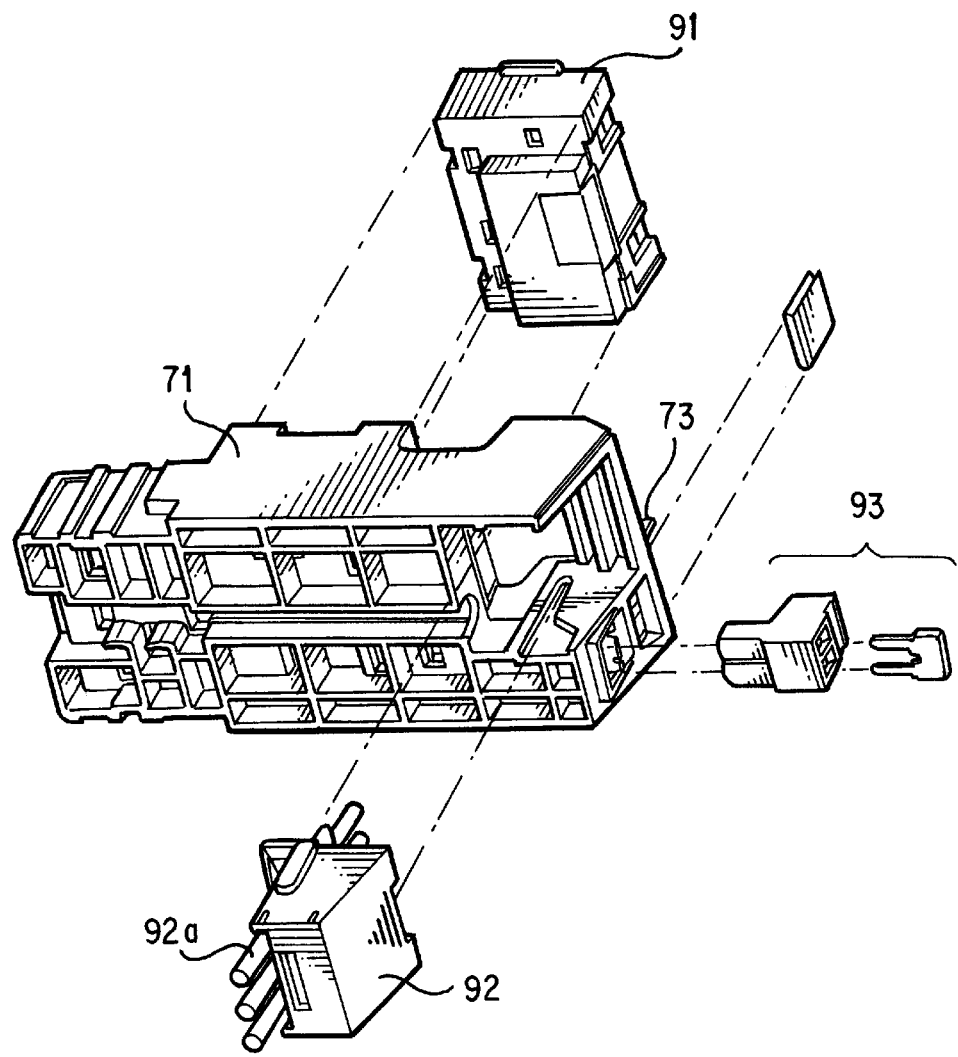
FIG. 8 shows an exploded view of the end unit.

The end unit 70 (see FIG. 7) includes a fitting 71 and control conductors intended to be connected, through one or more pins 73, to one or more downstream control terminals 66 of the contactor 60 and also includes a passage for the power cables connected to the load and which are to be connected to the downstream power terminals of the contactor. The unit 70 includes a fitting and connection heel 74. This heel is provided on the one hand with fitting shapes to co-operate with shapes, for example ribs and grooves and the walls of the housing 27 in the baseplate, in particular with a top abutment 27*a*, side abutments 27*b* and front retaining shoulders 27*c*. The heel 74 is, on the other hand, provided with control connection elements 75 directed along Z which co-operate with the connector 82 which is linked to the printed circuit and is accessible at the bottom of housing 27. A catch 76 controls elements that provide for the unit 70 to be clipped onto co-operating elements of the baseplate, notably provided in the housing 27, in order to strengthen the immobilisation of the sub-assembly on the baseplate. The catch 76 is accessible through an element provided at the front of the unit 70 or, as illustrated by a channel 76*a* in the unit.

In an application with an inverter, two fittings 71 are arranged side by side and one die 72 for the contactors 60*a* and 60*b*.

A command relay 91 for the contactor 60 coil is attached to the end unit 70 to be connected via this unit to the connector 83. A detachable device 92 for holding cables 92*a* from the motor is clipped into a housing in the fitting 71 of unit 70, this device 92 being used to avoid phase inversions during maintenance operations. A shunt 93 is provided at the front of the unit 70 to permit connection of two coil terminals towards the top; if it is the type that has one coil terminal towards the top and the other towards the bottom, of course the unit 70 includes the necessary pin 73.

In addition to the housings 26, 27 and the associated connectors 81, 82, the baseplate 20 includes side housings 28 that include connectors 83 to provide connection of connectors to which control and/or command conductors 90 are connected, these conductors providing the link with a process controller or forming part of an area bus. Supplementary side housings 29 that include connectors 84 are provided for the connection of power supply conductors to be connected to relays provided on the printed circuit 80 when voltage amplification is desired.

Figure 2:
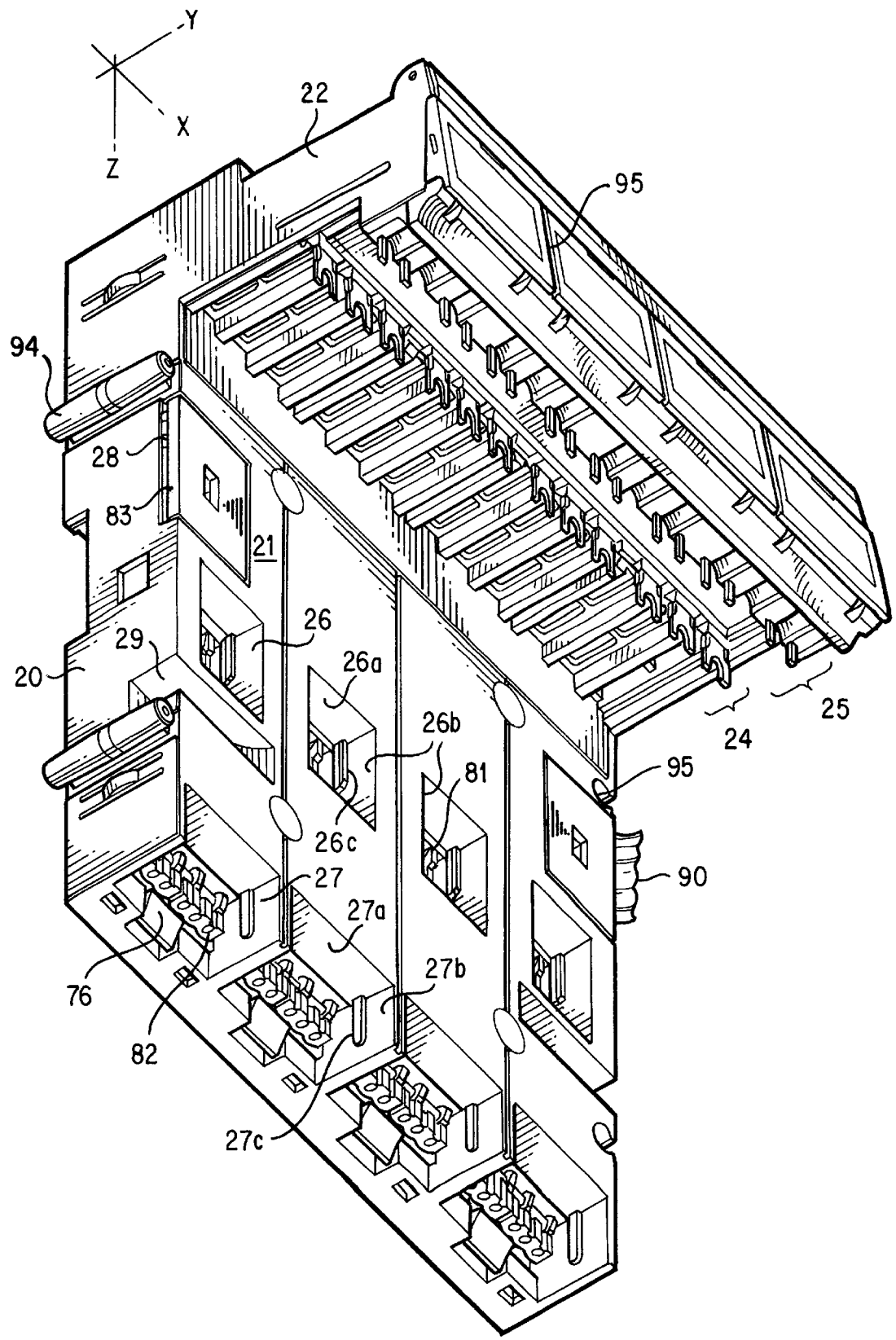
FIG. 2 shows the baseplate of the assembly in FIG. 1 in perspective from below.
Figure 3:
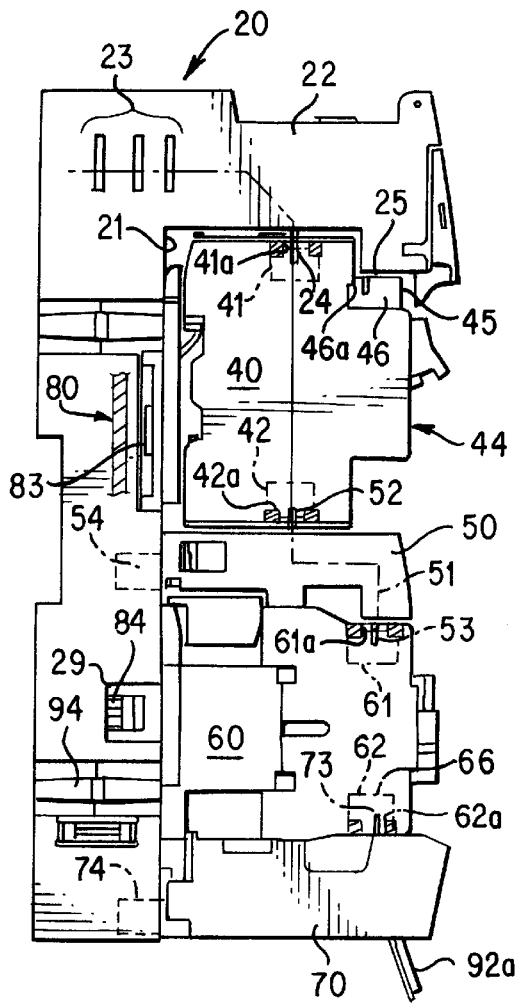
FIG. 3 is a side view of an embodiment variant of the assembly.

The baseplate 20 illustrated in FIG. 2 includes on the one side, lateral elements in relief 94 and on the other side complementary hollowed out elements 95, so as to assist the assembly of neighbouring baseplates. The set of power supply bars 23, the pins 24 connected to these bars and the control conductors which are connected to the pins 25 are moulded into bracket 22. A pivoting flap 96 capable of carrying labels associated with the various groups of devices is mounted at the front of the bracket 22 to conceal the inlets to the orifices 41*b*, 46*b* giving access to the circuit breaker 40 terminals and/or its auxiliary contact deck 45. The control terminals which have been described are the type that are clamped by a screw or by an elastic component.

The mounting of the sub-assemblies 30 onto the baseplate 20 of the device described is as follows.

The user begins by assembling the contactor 60 to the circuit breaker 40 through the intermediate unit 50 by on the one side plugging the power pins 52 into the orifices 42*a* of the terminals 42 of the circuit breaker and on the other side plugging the power pins 53 and the control pins 55 into the orifices 61*a*, 65*a* of the terminals 61, 65 of the contactor and tightening up the screws of the terminals. Then he engages the heel 54, of unit 50 into the housing 26 in the baseplate and then slides the sub-assembly in the direction Z along the support area 21. The sliding is carried out with lacteral guide being provided to the heel 54 in the housing 26 until the connector 81 is located and the power lugs 24 are engaged in the terminals 41 of the circuit breaker and the control pins 25 in the terminals 46 of its auxiliary contact deck 45.

The user then assembles the end unit 70 to the contactor by sliding this unit along Z to engage its heel 74 in the housing 27 until the connector 82 is located with insertion of its pin 73 in the orifice 66a of the control terminal 66 of the contactor; the cables are engaged in the downstream power terminals of the contactor and then the terminals are tightened. The catch 76 engages in the corresponding elastic element in the baseplate and ensures the sub-assembly is held and resists any accidental displacement in the direction Z, while the abutments 26b, 27b retain the sub-assembly in the direction X and the shoulders 26c, 27c prevent it from being removed from the baseplate in the direction Y. As a variant, the circuit breaker 40, the unit 50 and the contactor 60 can be successively assembled before fixing them to the baseplate by the addition and the locking on of unit 70.

The power connection of the assembly to a source of energy is carried out by the appropriate connection of conductors to the front terminal block 23a. The control connection is carried out by the connection of individual cables or a cable bundle to the side connector 83.

To disassemble a sub-assembly, the user unscrews the terminal screws 41 of the corresponding circuit breaker, then unlocks the catch 76 and grasps the shapes 58 of the intermediate unit 50 and the underneath of the end unit 70, and pulls the sub-assembly downwards in the direction Z, this movement been limited by the abutment of the heel 54 against the bottom of the housing 26, and finally extracts the sub-assembly from the baseplate in the direction X. To simply disassemble the contactor from a sub-assembly it is sufficient to unscrew the terminal screws 61 of the contactor, then to unlock the catch 76 and continue the operation as above.

It will be noted that when assembling, the wiring work which the user must carry out is considerably reduced since it consists simply of initially connecting the load to the contactor and connecting the three phase power supply and the source of command voltage for the contactors. The addition of a neighbouring assembly is carried out by interconnection of the control connectors 83 and if the case arises 84 putting them facing one another and with power terminals adjacent 23a. Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electrical equipment assembly for power control of at least one load, comprising:

for each load of said at least one load, a pair of devices mounted on a baseplate, each pair of devices, including,
a circuit breaker, and
a contactor having power terminals and control terminals, wherein:
control conductors for the electrical equipment assembly are included in the baseplate,
the baseplate has power pins and control pins that co-operate with respective power terminals and control terminals of the electrical equipment assembly,
at least one auxiliary unit is associated with the pair of devices and is fixed to at least one of the devices of the pair of devices, connected to the control terminals of the at least one device and provided with control conductors connected to the control pins of the baseplate in such a way that the pair of devices is connected to the baseplate with a prewired control linkage.

2. The assembly according to claim 1, wherein the at least one auxiliary unit is a detachable intermediate unit arranged between the circuit breaker and the contactor, the intermediate unit providing a power interconnection between the circuit breaker and the contactor as well as a control connection for the contactor with the baseplate in such a way that the pair of devices is connected to the baseplate with a prewired control linkage and a prewired power linkage.

3. The assembly according to claim 2, wherein the intermediate unit includes a fitting and a specific power interconnection device which is attached and held in a housing in the fitting.

4. The assembly according to claim 1, wherein the at least one auxiliary unit is an end unit adjoining the contactor and providing a control connection for the contactor.

5. The assembly according to claim 4, wherein the contactor includes an electromagnet having a coil and the end unit includes a command relay for the coil of the electromagnet of the contactor.

6. The assembly according to claim 4, wherein the end unit includes, in order to avoid phase inversions, a detachable device adapted for wiring to a motor and in which are clamped cables that connect downstream power terminals of the contactor to the at least one load.

7. The assembly according to claim 4, wherein an external command shunt for the contactor is attached to the end unit.

* * * * *